US012266903B2

(12) United States Patent
Iguchi (10) Patent No.: US 12,266,903 B2
(45) Date of Patent: Apr. 1, 2025

(54) LIGHT EMITTING DEVICE AND DETECTION APPARATUS

(71) Applicant: FUJIFILM Business Innovation Corp., Tokyo (JP)

(72) Inventor: Daisuke Iguchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 615 days.

(21) Appl. No.: 17/578,388

(22) Filed: Jan. 18, 2022

(65) Prior Publication Data

US 2023/0145018 A1 May 11, 2023

(30) Foreign Application Priority Data

Sep. 27, 2021 (JP) .................. 2021-157015

(51) Int. Cl.
 *H01S 3/00* (2006.01)
 *H01S 5/02* (2006.01)
 *H01S 5/026* (2006.01)
 *G01S 17/08* (2006.01)
 *H01S 5/02345* (2021.01)

(52) U.S. Cl.
 CPC .......... *H01S 5/0261* (2013.01); *H01S 5/0218* (2013.01); *G01S 17/08* (2013.01); *H01S 5/02345* (2021.01)

(58) Field of Classification Search
 CPC ... H01S 5/0261; H01S 5/0218; H01S 5/02345
 See application file for complete search history.

(56) References Cited

U.S. PATENT DOCUMENTS

| 6,181,718 | B1* | 1/2001 | Kobayashi | H01S 5/02251 |
| | | | | 372/38.1 |
| 2003/0123805 | A1* | 7/2003 | Akashi | G02B 6/4266 |
| | | | | 385/49 |
| 2003/0169153 | A1* | 9/2003 | Muller | G08B 13/2414 |
| | | | | 340/572.5 |
| 2014/0105234 | A1* | 4/2014 | Maeda | H01S 5/0428 |
| | | | | 372/38.02 |
| 2020/0366062 | A1* | 11/2020 | Iguchi | H01S 5/02345 |
| 2022/0166189 | A1* | 5/2022 | Wu | H01S 5/02345 |
| 2023/0078833 | A1* | 3/2023 | Iguchi | G01S 7/484 |
| | | | | 356/5.01 |

FOREIGN PATENT DOCUMENTS

JP 2020188239 11/2020

* cited by examiner

*Primary Examiner* — Kinam Park
(74) *Attorney, Agent, or Firm* — JCIPRNET (57) ABSTRACT

A light emitting device includes: a substrate that is provided with at least a part of a resonant circuit in which resonance occurs; and a light emitting element that emits light in a case where a current in the resonant circuit is supplied, in which the substrate has an electric accumulation layer provided in the resonant circuit and accumulating electric charge, and the resonant circuit is not provided with an electric accumulation element having a thickness larger than a thickness of the electric accumulation layer and accumulating electric charge.

8 Claims, 7 Drawing Sheets

| TYPE | INDUCTANCE (nH) | DETECTION DISTANCE (m) | PEAK CURRENT (A) | HALF-VALUE WIDTH OF PULSE (ps) | ACCURACY (mm) | CAPACITANCE(pF) | POWER SUPPLY VOLTAGE (V) |
|---|---|---|---|---|---|---|---|
| COLLECTIVE IRRADIATION TYPE | 0.4 | 5 | 5 | 296 | 44.4 | 50 | 16 |
| COLLECTIVE IRRADIATION TYPE | 0.4 | 5 | 5 | 151 | 22.65 | 13 | 30 |
| COLLECTIVE IRRADIATION TYPE | 0.4 | 10 | 15 | 449 | 67.35 | 115 | 30 |
| COLLECTIVE IRRADIATION TYPE | 0.4 | 20 | 30 | 888 | 133.2 | 450 | 30 |
| SCANNING TYPE | 0.4 | 20 | 5 | 114 | 17.1 | 10 | 30 |
| SCANNING TYPE | 0.8 | 50 | 15 | 350 | 52.5 | 35 | 75 |
| SCANNING TYPE | 0.8 | 100 | 30 | 700 | 105 | 140 | 75 |
| SCANNING TYPE | 0.8 | 200 | 75 | 1727 | 259.05 | 850 | 75 |

FIG. 7B

| CAPACITANCE (pF) | 11 | 3 | 2 | 2 | 0.01 |
|---|---|---|---|---|---|
| $\varepsilon r$ | 1009 | 100 | 10 | 5.7 | 0.05 |
| w1 (mm) | 10 | 10 | 2 | 1.1 | 0.02 |
| w2 (mm) | 10 | 20 | 1 | 1.15 | 0.02 |
| d (mm) | 10 | 10 | 2.4 | 2.4 | 0.05 |

FIG. 7C

| CAPACITANCE (pF) | 1009 | 100 | 10 | 5.7 | 0.05 |
|---|---|---|---|---|---|
| $\varepsilon r$ | 1063 | 1000 | 3 | 2 | 0.05 |
| w1 (mm) | 1063 | 100 | 4 | 3 | 0.01 |
| w2 (mm) | 1063 | 1000 | 3 | 2 | 0.05 |
| d (mm) | 1063 | 10 | 4 | 3 | 0.001 |

LIGHT EMITTING DEVICE AND DETECTION APPARATUS

CROSS-REFERENCE TO RELATED APPLICATIONS

This application is based on and claims priority under 35 USC 119 from Japanese Patent Application No. 2021-157015 filed Sep. 27, 2021.

BACKGROUND

(i) Technical Field

The present invention relates to a light emitting device and a detection apparatus.

(ii) Related Art

JP2020-188239A describes that in a light emitting device, a general-purpose (normal) capacitor is further connected to a series circuit of a light emitting element and a transistor.

SUMMARY

There is a technique for causing a light emitting element to emit light by supplying a current to the light emitting element by an electric accumulation element that accumulates electric charge. An electric accumulation element may be provided in the resonant circuit in which resonance occurs, and the current in the resonant circuit may be supplied to the light emitting element. In such a case, in a case where the electric accumulation element is provided in the resonant circuit without limitation, an angle of inclination of a rising edge of light may be gradual due to a capacitance and an inductance of the electric accumulation element in accordance with the electric accumulation element provided.

Aspects of non-limiting embodiments of the present disclosure relate to a light emitting device and a detection apparatus that accelerate the rising edge of light as compared with the configuration provided in the resonant circuit without limiting the electric accumulation element.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light emitting device including: a substrate that is provided with at least a part of a resonant circuit in which resonance occurs; and a light emitting element that emits light in a case where a current in the resonant circuit is supplied, in which the substrate has an electric accumulation layer provided in the resonant circuit and accumulating electric charge, and the resonant circuit is not provided with an electric accumulation element having a thickness larger than a thickness of the electric accumulation layer and accumulating electric charge.

BRIEF DESCRIPTION OF THE DRAWINGS

Exemplary embodiment(s) of the present invention will be described in detail based on the following figures, wherein.

DETAILED DESCRIPTION

Hereinafter, exemplary embodiments of the present invention will be described in detail with reference to the accompanying drawings.

Figure 1:
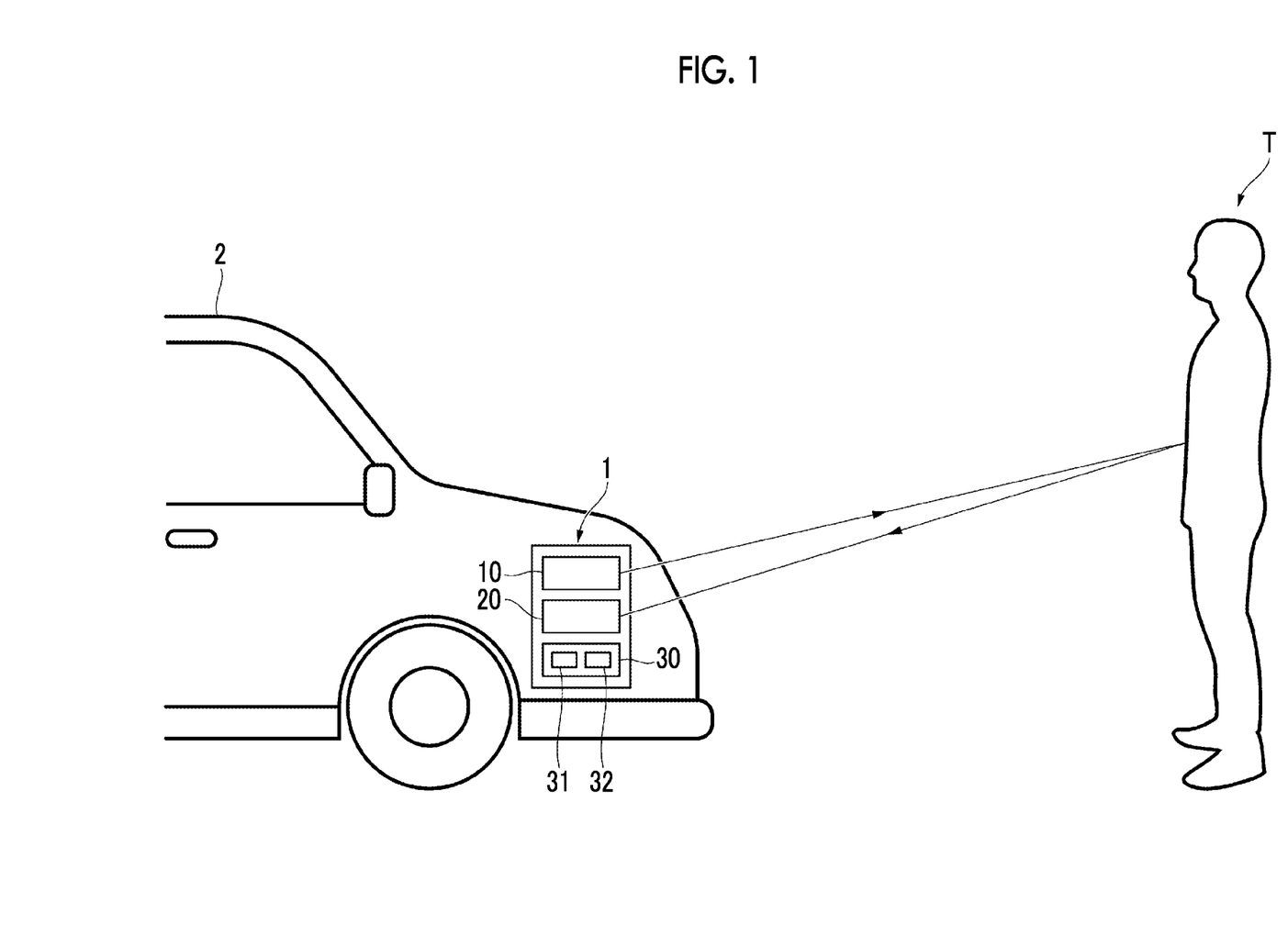
FIG. 1 is a diagram showing a configuration example of a detection apparatus.

FIG. 1 is a diagram showing a configuration example of the detection apparatus 1. The detection apparatus 1 is a device which detects a distance from the detection apparatus 1 to an object. The object as a target to which the detection apparatus 1 detects the distance is hereinafter referred to as a target object T. In the present exemplary embodiment, the light detection and ranging (LiDAR) is used as a method for the detection apparatus 1 to detect a distance to the target object T. The LiDAR is to measure the distance to the target object T by detecting light. The LiDAR includes a scanning type LiDAR which scans light and a collective irradiation type LiDAR which collectively irradiates light within a predetermined angle range. In the present exemplary embodiment, the scanning type LiDAR detects the distance to the target object T.

In the LiDAR, the time of flight (TOF) is used. The TOF is to measure the distance to the target object T on the basis of a time period in which light travels. The TOF includes the indirect time of flight (iTOF) and the direct time of flight (dTOF). The iTOF is a method of measuring the distance to the target object T on the basis of a difference between a phase of the emitted light and a phase of the received light. The dTOF is a method of measuring the distance to the target object T on the basis of a time period from emission of the light to light reception.

The detection apparatus 1 includes a light emitting device 10, a light receiving unit 20, and a detection unit 30.

The light emitting device 10 is a device which emits light. Examples of the light emitting device 10 include a vertical cavity surface emitting laser (VCSEL). The VCSEL is a laser which emits light in a direction perpendicular to a surface of a substrate. The light emitting device 10 of the present exemplary embodiment generates a pulsed current by resonance, and emits light by the generated current.

A configuration of the light emitting device 10 will be described in detail later.

The light receiving unit 20 as an example of the light receiving unit receives light based on irradiation of the light emitted from the light emitting device 10 to the target object T. In a case where the light receiving unit 20 receives light, electric charge is generated. Examples of the light based on the irradiation of the target object T with the light emitted from the light emitting device 10 include light emitted from the light emitting device 10 and reflected by the target object T, and light scattered by the target object T to which the light is emitted from the light emitting device 10. The light emitted from the light emitting device 10 may be referred to as emitted light below. The light emitted from the light emitting device 10 and reflected by the target object T is hereinafter referred to as reflected light. The light scattered by the target object T, to which the light is emitted from the light emitting device 10, is hereinafter referred to as scattered light.

Examples of the light receiving unit 20 include an optical sensor which detects light. Examples of the optical sensor include semiconductors such as a single photon avalanche diode (SPAD).

The detection unit 30 as an example of the detection unit detects the distance from the detection apparatus 1 to the target object T, on the basis of the light received by the light receiving unit 20. The detection unit 30 has a time measurement unit 31 and a measurement unit 32.

The time measurement unit 31 measures a time period.

The measurement unit 32 acquires information indicating a time period from emission of the light from the light emitting device 10 to generation of electric charge by the light receiving unit 20 from the time measurement unit 31. Then, from the acquired information, the distance from the detection apparatus 1 to the target object T is measured. More specifically, the measurement unit 32 measures the distance from the detection apparatus 1 to the target object T from Expression (1).

$$L = (c \times t)/2 \qquad (1)$$

In Expression (1), L is the distance from the detection apparatus 1 to the target object T. c is a speed of light. t is a time period from emission of the light from the light emitting device 10 to generation of electric charge by the light receiving unit 20. In addition, the measurement unit 32 measures the distance from the detection apparatus 1 to the target object T by setting a time period from emission of the light from the light emitting device 10 to generation of electric charge by the light receiving unit 20 to a time period from emission of the light from the light emitting device 10 to light reception by the light receiving unit 20.

The detection apparatus 1 is provided in a movable body 2 which is traveling. In the illustrated example, an automobile is shown as the movable body 2. The movable body 2 is not limited to the illustrated example. The movable body 2 may be, for example, a drone, a train, a ship, an airplane, or the like. The movable body 2 may be a computer carried by a user of the detection apparatus 1.

In the illustrated example, a human being is shown as the target object T, but the target object T is not limited to the human being. The target object T may be any object as long as the object reflects the light emitted from the light emitting device 10 or scatters the light by being irradiated with the light emitted from the light emitting device 10.

The detection apparatus 1 of the present exemplary embodiment includes a distance of 0.1 m or more and 500 m or less as a detection target as a distance to the target object T.

Next, a configuration of the light emitting device 10 will be described.

Figure 2:
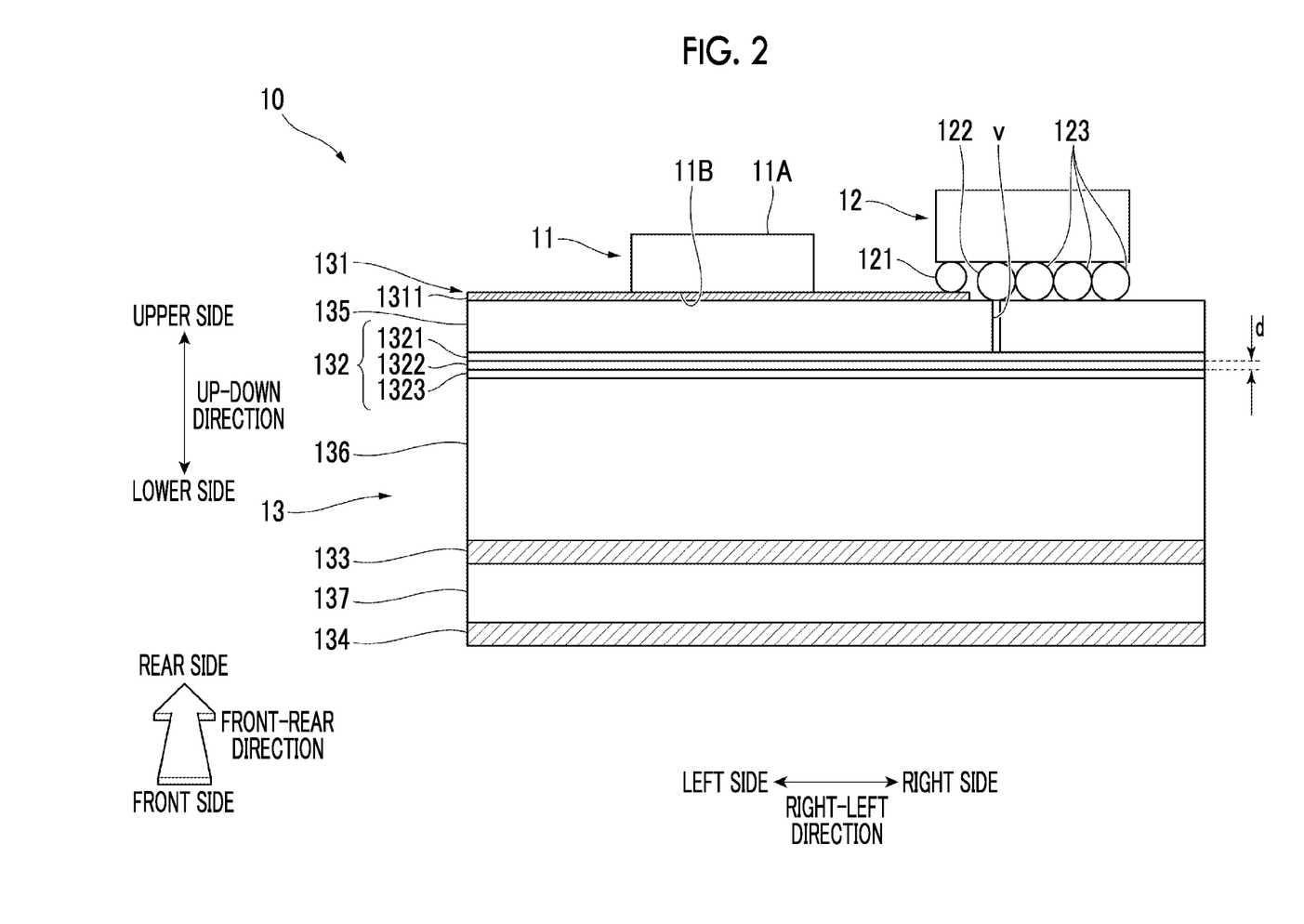
FIG. 2 is a cross-sectional view of a light emitting device.

FIG. 2 is a cross-sectional view of the light emitting device 10. In FIG. 2, an upper side of a page showing the light emitting device 10 may be referred to as "upper side", a lower side of the page may be referred to as "lower side", and directions toward the sides may be referred to as "up-down direction". A left side of the page showing the light emitting device 10 may be referred to as "left side", a right side of the page may be referred to as "right side", and directions toward the sides may be referred to as "right-left direction". A front side of the page showing the light emitting device 10 may be referred to as "front side", a rear side of the page may be referred to as "rear side", and directions toward the sides may be referred to as "front-rear direction".

Figure 3A:
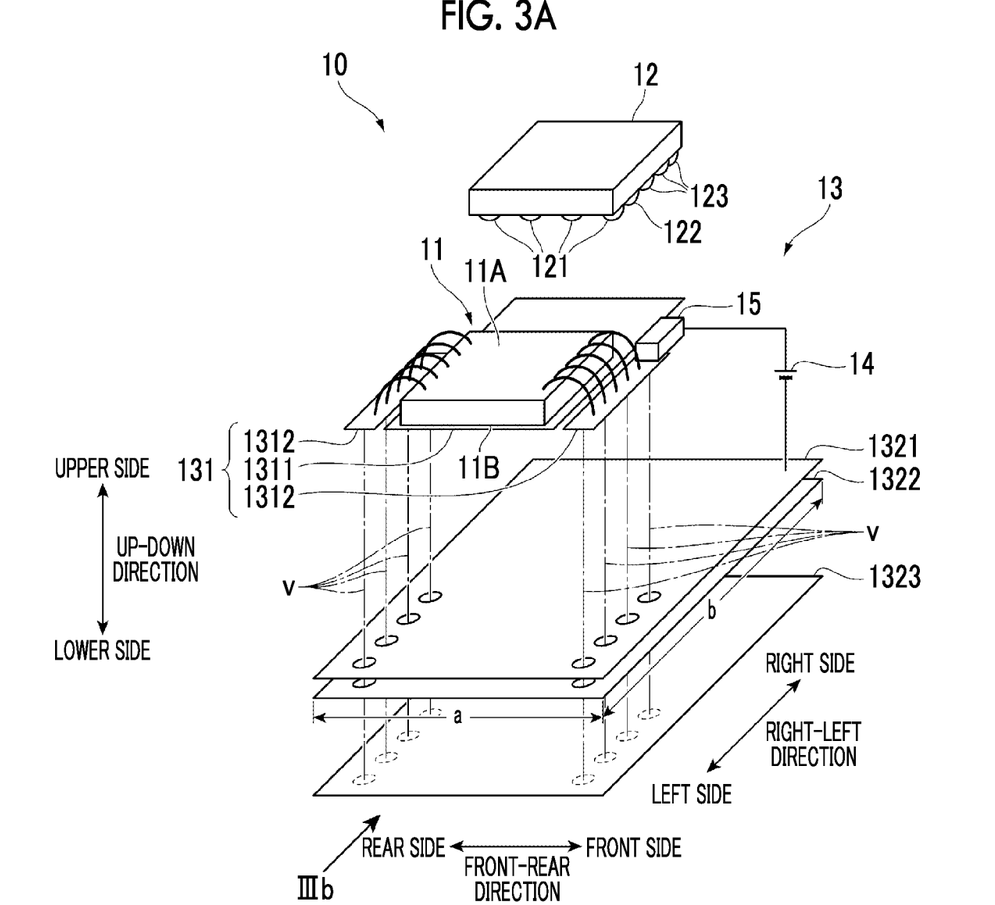
FIG. 3A is a perspective view of the light emitting device.
Figure 3B:
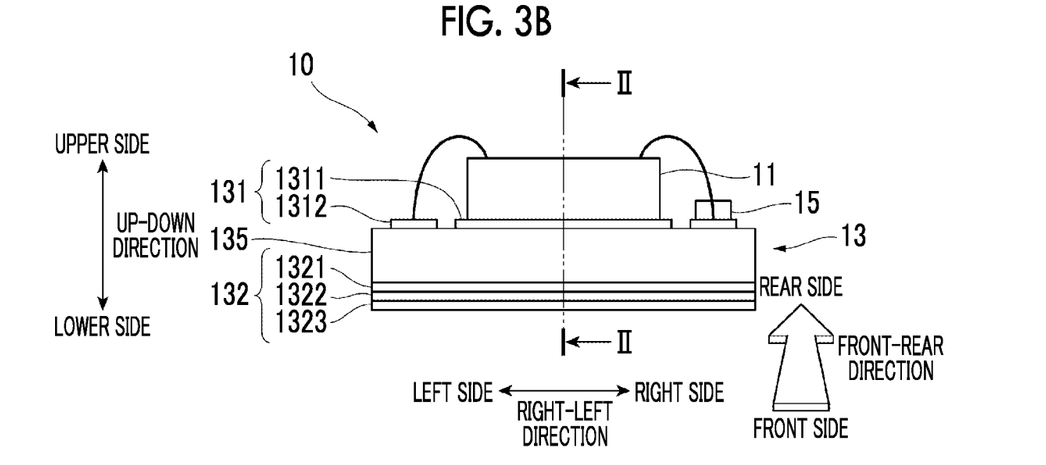
FIG. 3B is a view of the light emitting device viewed from the left side of the light emitting device.

FIG. 3A is a perspective view of the light emitting device 10, and FIG. 3B is a view of the light emitting device 10 viewed from the left side of the light emitting device 10. It should be noted that FIG. 2 is a cross-sectional view taken along the line II-II of FIG. 3B. FIG. 3A shows a state in which the light emitting device 10 is disassembled for convenience of explanation. FIG. 3A does not show, for convenience of explanation, configurations of a middle electric path layer 133, a lower electric path layer 134, an upper insulation layer 135, a reinforcement layer 136, and a lower insulation layer 137 which will be described later. FIG. 3B does not show, for convenience of explanation, the configurations of the middle electric path layer 133, the lower electric path layer 134, the reinforcement layer 136, and the lower insulation layer 137 which will be described later.

As shown in FIG. 2, the light emitting device 10 includes a light emitting element 11, an operation unit 12, and a substrate 13.

The light emitting element 11 is an element which emits light in a case where a current is supplied. The light emitting element 11 emits light toward the upper side, which is a direction perpendicular to the surface of the substrate 13. The light emitting element 11 is provided with an anode surface 11A and a cathode surface 11B. The anode surface 11A is an upper surface of the light emitting element 11 and is a surface which forms the anode. The cathode surface 11B is a bottom surface of the light emitting element 11 and is a surface which forms a cathode.

The operation unit 12 is an integrated circuit (IC) which operates the light emitting element 11. The operation unit 12 is provided with a cathode terminal 121, a ground terminal 122, and a solder portion 123.

The cathode terminal 121 is a terminal which forms a cathode.

The ground terminal 122 is a terminal which forms a ground. The ground is an electric path which serves as a reference for electric potential in an electronic circuit.

The solder portion 123 is solder which adheres to the substrate 13.

The substrate 13 is a substrate on which a part of the resonant circuit is provided. A resonant circuit is an electronic circuit in which resonance occurs. The substrate 13 has a plurality of layers. More specifically, the substrate 13 has an upper electric path layer 131, a capacitor layer 132, the middle electric path layer 133, the lower electric path layer 134, the upper insulation layer 135, the reinforcement layer 136, and the lower insulation layer 137.

The upper electric path layer 131 is a layer which forms an electric path. The upper electric path layer 131 is provided on the uppermost side of the substrate 13. The cathode terminal 121 of the operation unit 12 is attached to the upper electric path layer 131.

The capacitor layer 132 as an example of the electric accumulation layer is a layer for accumulating electric charge. That is, the capacitor layer 132 is an electric accumulation element which accumulates electricity. In addition, the capacitor layer 132 supplies a current to the light emitting element 11 by discharging the accumulated electric charge. The capacitor layer 132 is provided on the lower side of the upper electric path layer 131 in the substrate 13.

The middle electric path layer 133 is a layer which forms an electric path. The middle electric path layer 133 is provided on the lower side of the capacitor layer 132 in the substrate 13.

The lower electric path layer 134 is a layer which forms an electric path. The lower electric path layer 134 is provided on the lowermost side of the substrate 13.

Each of the middle electric path layer 133 and the lower electric path layer 134 is made of a metal material. Examples of the metal material include copper.

The upper insulation layer 135 is a layer which insulates the upper electric path layer 131 and the capacitor layer 132. The upper insulation layer 135 is provided between the upper electric path layer 131 and the capacitor layer 132 in the up-down direction. The ground terminal 122 and the solder portion 123 of the operation unit 12 are attached to the upper insulation layer 135.

The reinforcement layer 136 is a layer which supplements a strength of the substrate 13. The reinforcement layer 136 insulates the capacitor layer 132 and the middle electric path layer 133. The reinforcement layer 136 is provided between the capacitor layer 132 and the middle electric path layer 133 in the up-down direction.

The lower insulation layer 137 is a layer which insulates the middle electric path layer 133 and the lower electric path layer 134. The lower insulation layer 137 is provided between the middle electric path layer 133 and the lower electric path layer 134 in the up-down direction.

The upper insulation layer 135, the reinforcement layer 136, and the lower insulation layer 137 each are made of, for example, a prepreg. The prepreg is a material in which carbon fibers are preliminarily impregnated with a resin.

In the present exemplary embodiment, the ground terminal 122 of the operation unit 12 is connected to the capacitor layer 132 via a via hole V. The via hole is an opening portion for conduction between one end and the other end. By coating an inner circumferential surface of the opening portion with a metal material, one end and the other end are conductive. In the present exemplary embodiment, the ground terminal 122 and the capacitor layer 132 are conductive by providing the via hole V on the upper insulation layer 135.

As shown in FIGS. 3A and 3B, a cathode layer 1311 and an anode layer 1312 are provided on the upper electric path layer 131.

The cathode layer 1311 is a layer which forms a cathode. The cathode surface 11B of the light emitting element 11 is attached to the cathode layer 1311. More specifically, the entire surface of the cathode surface 11B is attached to the cathode layer 1311. The cathode layer 1311 is formed longer in the right-left direction than the light emitting element 11, and on the right side of the light emitting element 11, there is a portion of the cathode layer 1311 to which the cathode surface 11B is not attached. Then, the cathode terminal 121 of the operation unit 12 is attached to the portion of the cathode layer 1311 to which the cathode surface 11B is not attached (refer to FIG. 2). In addition, four cathode terminals 121 are provided in the operation unit 12 at equal intervals in the front-rear direction, and the four cathode terminals 121 are attached to the cathode layer 1311 of the upper electric path layer 131.

The anode layer 1312 is a layer which forms an anode. The anode layer 1312 is provided on each of the front side and the rear side of the cathode layer 1311. The anode layer 1312 is formed shorter in the right-left direction than the cathode layer 1311. More specifically, the anode layer 1312 is formed such that the length in the right-left direction is the same as the length of the light emitting element 11. The position of the anode layer 1312 in the right-left direction is aligned with the position of the light emitting element 11. The anode surface 11A of the light emitting element 11 and the anode layer 1312 are connected through a wire W made of a metal material. In the illustrated example, five wires W are connected to each of the anode layer 1312 provided on the front side of the cathode layer 1311 and the anode layer 1312 provided on the rear side of the cathode layer 1311.

The cathode layer 1311 and the anode layer 1312 each are made of a metal material. Examples of the metal material include copper.

A ground layer 1321, a dielectric layer 1322, and an anode layer 1323 are provided on the capacitor layer 132. The ground layer 1321, the dielectric layer 1322, and the anode layer 1323 are all formed in a rectangular shape.

The ground layer 1321 is a layer which forms a ground. The ground terminal 122 of the operation unit 12 is connected to the ground layer 1321 of the capacitor layer 132 via the via hole V (refer to FIG. 2). Although not shown, four ground terminals 122 are provided in the operation unit 12 at equal intervals in the front-rear direction, and the four ground terminals 122 each are connected to the ground layer 1321 via the via hole V. The ground layer 1321 is made of a metal material. Examples of the metal material include copper.

The dielectric layer 1322 is a layer which forms a dielectric substance. In the present exemplary embodiment, Faradflex (registered trademark) manufactured by Oak-Mitsui Inc. is used as the dielectric layer 1322.

In the present exemplary embodiment, a thickness of the dielectric layer 1322 in the up-down direction is the thickness d (refer to FIG. 2). A length of the dielectric layer 1322 in the front-rear direction is a length a (refer to FIG. 3A). A length of the dielectric layer 1322 in the right-left direction is a length b. An area of the dielectric layer 1322 is a product of the length a and the length b. In the present exemplary embodiment, the area of the dielectric layer 1322 is equal to each of the area of the ground layer 1321 and the area of the anode layer 1323.

The anode layer 1323 is a layer which forms the anode. As shown in FIG. 3A, the anode layer 1323 of the capacitor layer 132 is connected to the anode layer 1312 of the upper electric path layer 131 via the via hole V. In the present exemplary embodiment, by providing the via hole V on the upper insulation layer 135, the ground layer 1321 of the capacitor layer 132, and the dielectric layer 1322, the anode layer 1312 of the upper electric path layer 131 and the anode layer 1323 of the capacitor layer 132 are conductive. In the illustrated example, four via holes V are provided for each anode layer 1312 of the upper electric path layer 131. Each of the four via holes V is provided at an equal interval in the right-left direction.

The anode layer 1323 is made of a metal material. Examples of the metal material include copper.

As shown in FIG. 3A, a power supply 14 and a resistor 15 are provided in the light emitting device 10.

The power supply 14 supplies electric charge to the capacitor layer 132 of the substrate 13. One end of the power supply 14 is connected to the resistor 15, and the other end is connected to the ground layer 1321 of the capacitor layer 132.

The resistor 15 as an example of the suppression unit has a predetermined electric resistance. One end of the resistor 15 is connected to the power supply 14, and the other end is connected to the anode layer 1312 of the upper electric path layer 131. That is, the resistor 15 is connected to the electric path between the power supply 14 and the capacitor layer 132. In the present exemplary embodiment, electric charge transfer between the power supply 14 and a resonant circuit RC is restricted in accordance with the electric resistance of the resistor 15. More specifically, the higher the electric resistance of the resistor 15, the more difficult it is for electric charge to move between the power supply 14 and the resonant circuit RC.

Figure 4:
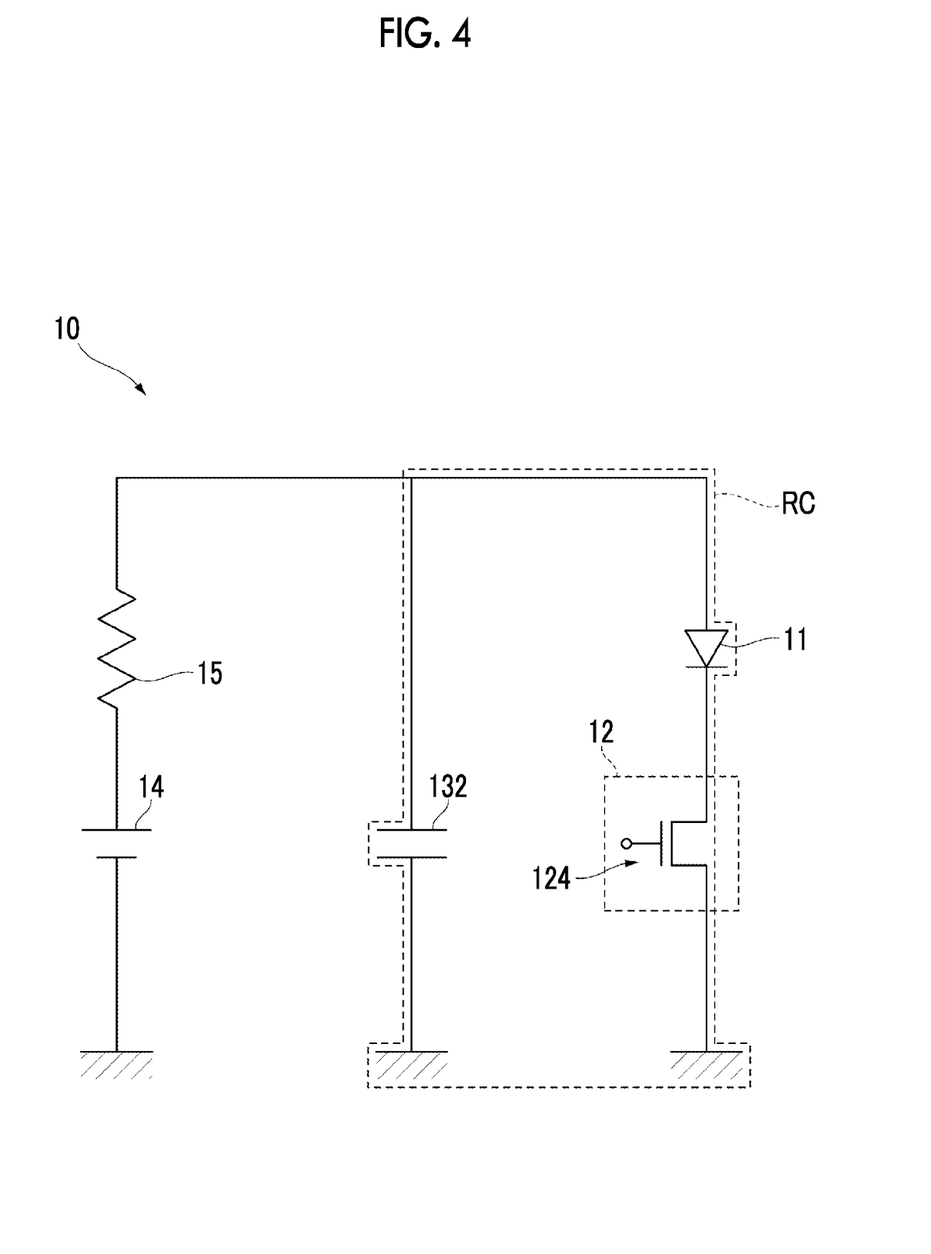
FIG. 4 is a diagram showing an electronic circuit of the light emitting device.

FIG. 4 is a diagram showing an electronic circuit of the light emitting device 10.

As shown in FIG. 4, a resonant circuit RC is provided in the electronic circuit of the light emitting device 10. The light emitting element 11, the operation unit 12, and the capacitor layer 132 are provided in the resonant circuit RC of the present exemplary embodiment. Although not shown, in the resonant circuit RC, the anode layer 1312 of the upper electric path layer 131 is connected to the electric path between the light emitting element 11 and the capacitor layer 132. In the resonant circuit RC, the cathode layer 1311 of the upper electric path layer 131 is connected to the electric path between the light emitting element 11 and the operation unit 12.

A transistor 124 is provided in the operation unit 12. The transistor 124 is an electronic switch which switches between a state in which the resonant circuit RC is conductive and a state in which the resonant circuit RC is not conductive, depending on the applied voltage. In a case where a voltage equal to or greater than a predetermined value is not applied to the transistor 124, the transistor 124 is in an OFF state. In such a case, since the circuit to which the transistor 124 is connected is cutoff and the resonant circuit RC is being not conductive, no current is supplied to the light emitting element 11. In a case where a voltage equal to or greater than a predetermined value is applied to the transistor 124, the transistor 124 is in an ON state. In such a case, the circuit to which the transistor 124 is connected is connected, and the resonant circuit RC is being conductive. Then, in the state, in the resonant circuit RC, the impedance drops at a specific frequency and resonance occurs, and the pulsed current generated by the resonance is supplied to the light emitting element 11. It should be noted that the specific frequency, that is, a frequency at which resonance occurs may be referred to as a resonance frequency below. The pulsed current may be simply referred to as a pulse below.

The resistor 15 is connected to an electric path between the power supply 14 and the resonant circuit RC.

In the present exemplary embodiment, in a case where the transistor 124 is in an OFF state, electric charge is supplied from the power supply 14 to the capacitor layer 132 via the resistor 15, and a voltage is applied to the capacitor layer 132. That is, the capacitor layer 132 is charged.

In a case where the transistor 124 is in an ON state, the capacitor layer 132 discharges electric charge and a current is supplied from the capacitor layer 132 to the light emitting element 11. Therefore, the light emitting element 11 emits light. In a case where the capacitor layer 132 discharges electric charge, the transistor 124 is put into an OFF state again and the capacitor layer 132 is charged. As described above, in the present exemplary embodiment, charging of the capacitor layer 132 and light emission of the light emitting element 11 performed by supplying a current from the capacitor layer 132 to the light emitting element 11 are repeatedly performed.

As described above, the light emitting device 10 of the present exemplary embodiment generates a pulse by resonance at a specific frequency, and supplies the generated pulse to the light emitting element 11 to cause the light emitting element 11 to emit light. Here, in the dTOF which is a kind of TOF described above, it is not necessary to have a range of frequencies for generating a current, and a current may be generated by lowering the impedance in the electronic circuit at a single frequency. On the other hand, in the iTOF, since it is necessary to generate a current in a frequency range wider than a frequency range of the dTOF, it is necessary to lower the impedance in the electronic circuit in the wider frequency region. Therefore, the light emitting device 10 of the present exemplary embodiment is used as a light source for the dTOF on the basis of a property of lowering the impedance in the resonant circuit RC at a resonance frequency which is a single frequency and generating a pulse by resonance. However, the light emitting device 10 may be used as a light source for the iTOF.

The light emitting device 10 is necessary to shorten the time period from the start of emission of the light to the increase in intensity of the emitted light, that is, to accelerate the rising edge of the intensity of the emitted light.

Figure 5:
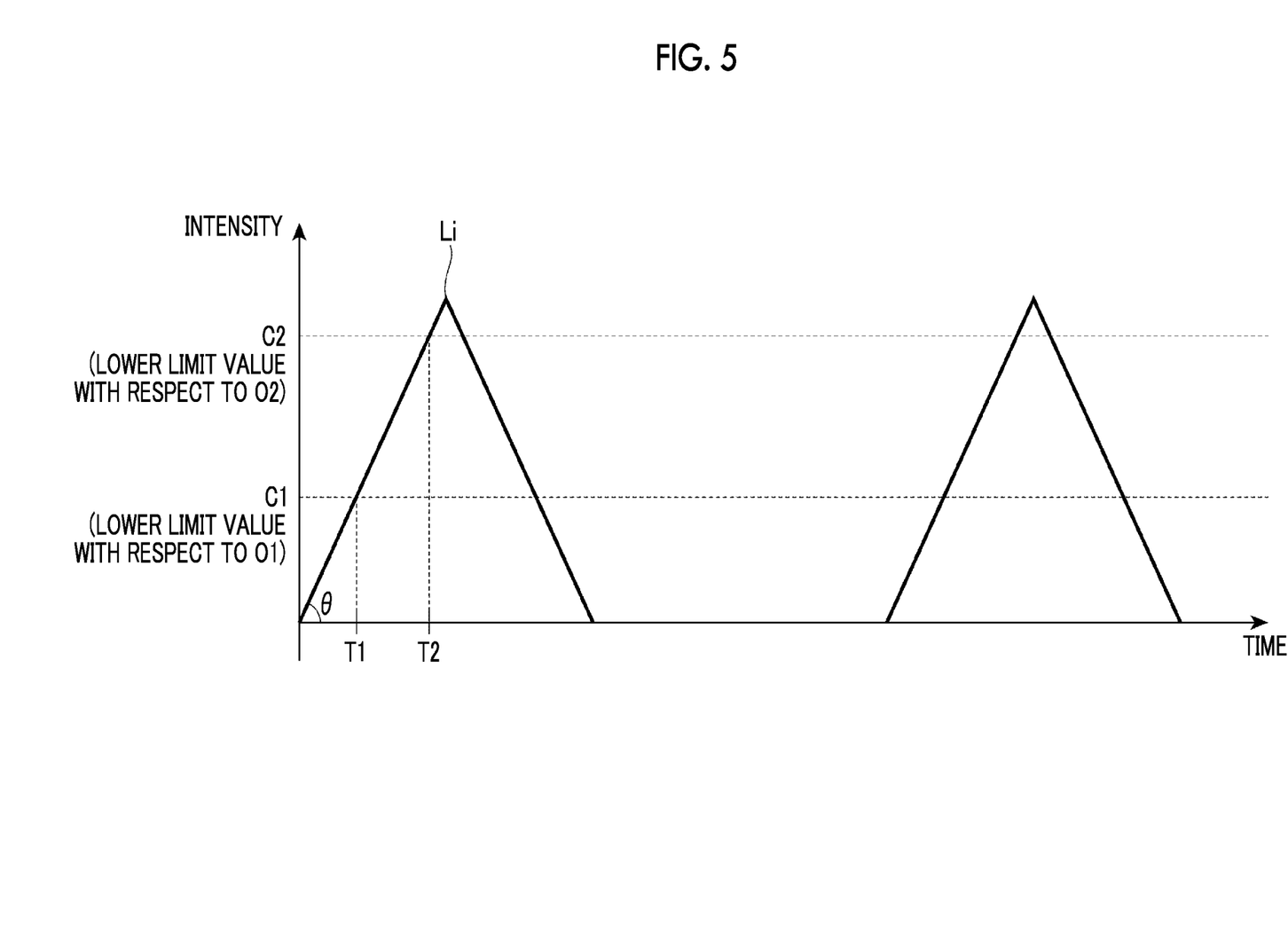
FIG. 5 is a diagram showing a relationship between the time period elapsed from the start of light emission by the light emitting device and the intensity of emitted light.

FIG. 5 is a diagram showing a relationship between the time period, which elapses after the light emitting device 10 starts to emit light, and the intensity of the emitted light. The intensity of the emitted light has a sharper waveform than the waveform shown in FIG. 5 due to a time delay in rising edge due to the influence of the relaxation oscillation. FIG. 5 shows the intensity of the emitted light in a case where the influence of the relaxation oscillation is not taken into consideration.

In FIG. 5, the horizontal axis indicates the time period which elapses after the light emitting device 10 starts to emit light, and the vertical axis indicates the intensity of the emitted light Li. In the emitted light Li shown in FIG. 5, an angle, at which the rising edge of the intensity of the emitted light Li is inclined with respect to the passage of time, is an angle θ. In the following description, the rising edge of light intensity may be simply referred to as the rising edge of light. The angle θ, at which the rising edge of the emitted light is inclined with respect to the passage of time, may be referred to as an inclination angle θ.

As described above, the detection apparatus 1 of the present exemplary embodiment detects a distance to the target object T on the basis of the time period from the start of light emission to reception of reflected light or scattered light. Here, the lower limit value of the intensity of the emitted light necessary to generate the reflected light depends on the reflectance of the light in the target object T. More specifically, the higher the reflectance of light in the target object T, the lower the lower limit value of the intensity of the emitted light necessary to generate the reflected light. A reflectance of the light is a ratio of the intensity of the emitted light to the intensity of the reflected light. The reflectance of light is determined for each target object T.

Here, an intensity C1 shown in FIG. 5 is a lower limit value of the intensity of the emitted light Li necessary to generate the reflected light from a target object O1 having a specific light reflectance. An intensity C2 shown in FIG. 5 is a lower limit value of the intensity of the emitted light Li necessary to generate the reflected light from a target object O2 of which the reflectance is lower than the reflectance of the target object O1. In the following description, the lower limit value of the intensity of the emitted light Li necessary to generate the reflected light may be referred to as an optical lower limit value.

In a case where the detection apparatus 1 irradiates the target object O1 with the emitted light Li, when the time period T1 elapses after the detection apparatus 1 starts to emit light, the light having the intensity of the lower limit value C1 is emitted. In a case where the detection apparatus 1 irradiates the target object O2 with the emitted light Li, when the time period T2 elapses after the detection apparatus 1 starts to emit light, the light having the intensity of the lower limit value C2 is emitted. Here, in the case where the target object to be irradiated with the emitted light Li is the target object O2 as compared with the case of the target object O1, the time period from the start of light emission of the detection apparatus 1 to emission of the light of which the intensity is the optical lower limit value increases. In a case where the time period to emission of the light of which the intensity is the optical lower limit value increases, the time period from the start of light emission by the detection apparatus 1 to reception of the reflected light also increases. In such a case, even in a case where the distance from the detection apparatus 1 to the target object O1 and the distance from the detection apparatus 1 to the target object O2 are the same, regarding the time period from the start of light emission to reception of the reflected light by the detection apparatus 1, the time period of the target object O2 is longer than the time period of the target object O1 by a difference between the time period T1 and the time period T2. In other words, depending on the reflectance of the target object T, there is a variation in time period from the start of light emission of the detection apparatus 1 to emission of the light of which the intensity is the optical lower limit value, and there is also a variation in the result detected as the distance from the detection apparatus 1 to the target object T by the variation in time period. Therefore, for example, although there is no particular limitation, it is desired that the time period from the start of light emission of the detection apparatus 1 to emission of the light of which the intensity is the optical lower limit value is small for each target object T.

In a case where the inclination angle θ is gradual, that is, in a case where the rising edge of the emitted light Li occurs slower, for each the target object T, the variation in time period from the start of light emission of the detection apparatus 1 to emission of the light of which the intensity is the optical lower limit value increases such that the difference between the time period T1 and the time period T2 increases. In a case where the rising edge of the light occurs faster, for each the target object T, the variation in time period from the start of light emission of the detection apparatus 1 to emission of the light of which the intensity is the optical lower limit value decreases such that the difference between the time period T1 and the time period T2 decreases.

As the current supplied to the light emitting element 11 increases, the intensity of the emitted light increases. Thus, the faster the rising edge of the current in the light emitting device 10, the faster the rising edge of the emitted light. Therefore, in a case where the rising edge of the current occurs faster in the light emitting device 10, for each target object T, the variation in time period from the start of light emission by the detection apparatus 1 to emission of the light of which the intensity is the lower limit value decreases.

Then, in the present exemplary embodiment, by generating a pulse by resonance in the resonant circuit RC, a pulse having a shorter pulse width and a faster rising edge is generated as compared with the case where the pulse is generated without resonance. As described above, in a case where the rising edge of the current occurs faster, the variation in time period from the start of resonance in the light emitting device 10 to the start of emission of the light by the light emitting element 11 also decreases.

Here, in the resonant circuit RC, in a case where the impedance is low at a frequency different from the resonance frequency, resonance may not occur. In such a case, even in a case where a current is generated in the light emitting device 10, the rising edge of the current occurs slowly, and the rising edge of the emitted light also occurs slowly accordingly.

Therefore, in the present exemplary embodiment, the electric accumulation element provided in the resonant circuit RC is limited. More specifically, the electric accumulation element other than the capacitor layer 132 is provided in the resonant circuit RC. In such a case, as compared with the configuration in which the electric accumulation element is provided in the resonant circuit RC without limitation, a decrease in impedance at a frequency different from the resonance frequency is suppressed by an amount that increases in capacitance and inductance in the resonant circuit RC are suppressed.

In the present exemplary embodiment, the light emitting device 10 further includes a resistor 15 which is connected to a circuit between the power supply 14 and the resonant circuit RC and suppresses electric charge transfer between the power supply 14 and the resonant circuit RC.

In a case where the resonant circuit RC is affected by a circuit outside the resonant circuit RC due to electric charge being supplied from the power supply 14 to the capacitor layer 132 and the like while resonance is being generated, the resonance in the resonant circuit RC may be attenuated. Therefore, in the present exemplary embodiment, by connecting the resistor 15 to the circuit between the power supply 14 and the resonant circuit RC, the resonant circuit RC is suppressed from being affected by the power supply 14 while resonance is being generated in the resonant circuit RC.

In the present exemplary embodiment, the substrate 13 has a plurality of layers including the capacitor layer 132, and the light emitting element 11 is provided to overlap the plurality of layers.

In a case where the light emitting element 11 is provided so as not to overlap the capacitor layer 132, such as in a case where the light emitting element 11 is disposed away from the substrate 13 in the front-rear direction (refer to FIG. 3A) or in the right-left direction, as compared with the case where the light emitting element 11 overlaps the capacitor layer 132, the electric path between the light emitting element 11 and the capacitor layer 132 becomes longer. In other words, in a case where the light emitting element 11 is provided so as not to overlap with the capacitor layer 132, as compared with the case where the light emitting element 11 overlaps the capacitor layer 132, the electric path in the resonant circuit RC becomes longer. Therefore, in the present exemplary embodiment, the light emitting element 11 is provided to overlap the capacitor layer 132.

In particular, in the present exemplary embodiment, the plurality of layers, with which the light emitting element 11 overlaps, on the substrate 13 include a cathode layer 1311 which is provided in the resonant circuit RC and through which the current supplied to the light emitting elements 11 passes.

Modification Example

Next, a modification example will be described.

The present exemplary embodiment has described that the resistor 15 which suppresses electric charge transfer between the power supply 14 and the resonant circuit RC is provided in the light emitting device 10. Here, the suppression unit suppressing electric charge transfer between the power supply 14 and the resonant circuit RC is not limited to the resistor 15.

Figure 6:
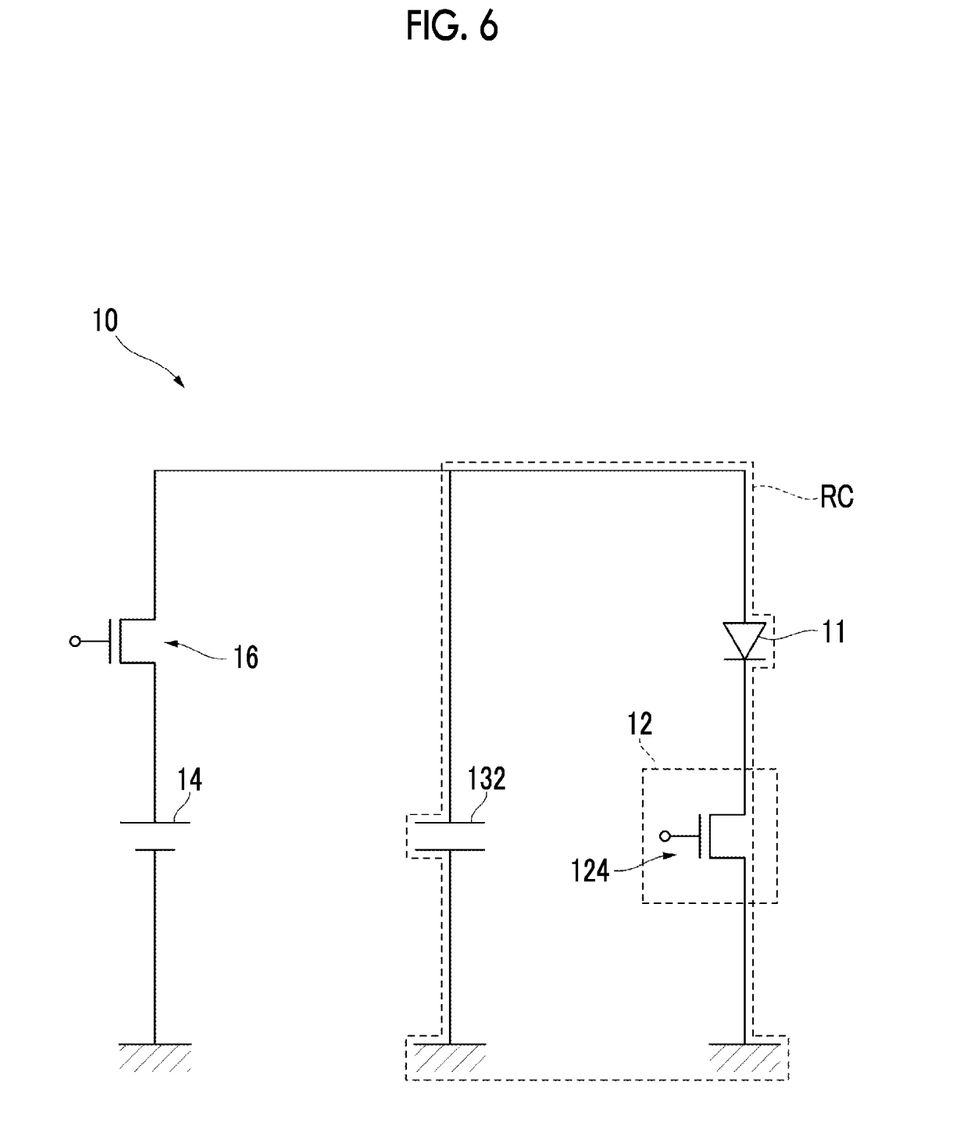
FIG. 6 is a diagram showing an electronic circuit of a light emitting device as a modification example.

FIG. 6 is a diagram showing an electronic circuit of the light emitting device 10 as the modification example.

In the modification example, as shown in FIG. 6, the transistor 16 is connected to the circuit between the power supply 14 and the resonant circuit RC instead of the resistor 15.

The transistor 16 as an example of the suppression unit is an electronic switch which switches between a state in which the circuit from the power supply 14 to the resonant circuit RC is conductive and a state in which the circuit is not conductive, depending on the applied voltage.

In a case where a voltage equal to or greater than a predetermined value is applied to the transistor 16, the transistor 16 is in an ON state. In such a case, the circuit to which the transistor 16 is connected is connected and the circuit from the power supply 14 to the resonant circuit RC is being conductive. Therefore, electric charge is supplied from the power supply 14 to the capacitor layer 132 of the substrate 13, and the capacitor layer 132 is charged. At that time, the electric charge is supplied earlier than the case where the electric charge is supplied via the resistor 15 or the like having the resistance necessary for making the resonant circuit RC independent.

In a case where a voltage equal to or greater than a predetermined value is not applied to the transistor 16, the transistor 16 is in an OFF state. In such a case, the circuit to which the transistor 16 is connected is cutoff, and the circuit from the power supply 14 to the resonant circuit RC is being not conductive. At this time, the electric charge does not move between the power supply 14 and the resonant circuit RC. In a case where the charging of the capacitor layer 132 is completed at this time, the current is supplied from the capacitor layer 132 to the light emitting element 11. Therefore, the light emitting element 11 emits light.

As described above, in the present exemplary embodiment, the transistor 16 cuts off conduction in the circuit between the power supply 14 and the resonant circuit RC, thereby facilitating the generation of resonance in the resonant circuit RC.

Next, parameters of the detection apparatus 1 necessary to accelerate the rising edge of the light will be described. In the following description, it is assumed that the light emitting device 10 is used as a light source for dTOF.

Figure 7A:
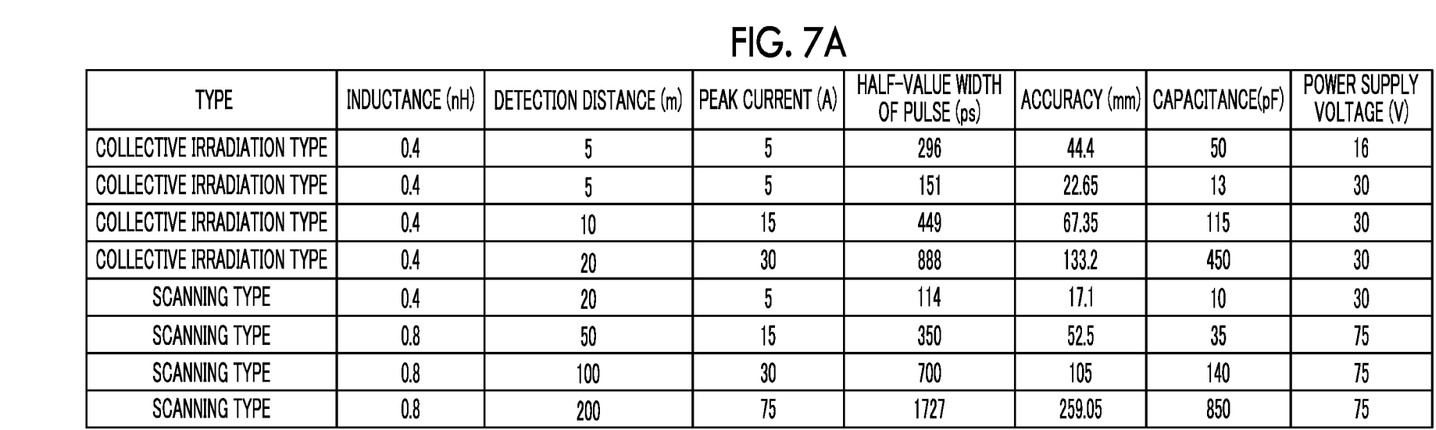
FIG. 7A is a table showing parameters for a detection apparatus.

FIG. 7A is a table showing parameters for the detection apparatus 1.

The term "type" shown in FIG. 7A means a type of LiDAR used in the detection apparatus 1. The term "collective irradiation type" shown in "type" means that a collective irradiation type LiDAR is used in the detection apparatus 1. The term "scanning type" shown in "type" means that a scanning type LiDAR is used in the detection apparatus 1.

The term "inductance" shown in FIG. 7A means an inductance in the resonant circuit RC.

The term "detection distance" shown in FIG. 7A means a distance to the target object T as a detection target of the detection apparatus 1.

The term "peak current" shown in FIG. 7A means a maximum value of the current generated in a case where the transistor 124 is turned on.

The term "half-value width of the pulse" shown in FIG. 7A means a half-value width of the pulse generated by resonance in the resonant circuit RC. The term "half-value width of pulse" can also be regarded as the time period necessary from the generation of a pulse to the rising edge of current.

The term "accuracy" shown in FIG. 7A means an accuracy with which the detection apparatus 1 detects the distance to the target object T. The term "accuracy" can also be regarded as an error in the distance to the target object T detected by the detection apparatus 1, which is generated for the time period necessary from the start of light emission by the detection apparatus 1 to the rising edge of the light.

The term "capacitance" shown in FIG. 7A means a capacitance of the dielectric layer 1322 in the capacitor layer 132.

The term "power supply voltage" shown in FIG. 7A means a voltage applied by the power supply 14.

The values shown in FIG. 7A will be specifically described. In the detection apparatus 1 in which the "detection distance" is "5" or more and "20" or less, the "inductance" is 0.4. In the detection apparatus 1 in which the "detection distance" is "50" or more and "200" or less, the "inductance" is 0.8.

In any of the detection apparatuses 1 shown in FIG. 7A, the capacitance of the dielectric layer 1322 is 10 pF or more and 1000 pF or less. In other words, in a case where the dielectric layer 1322 having a capacitance of 10 pF or more and 1000 pF or less is used, the rising edge of the light occurs faster.

Figure 7B:
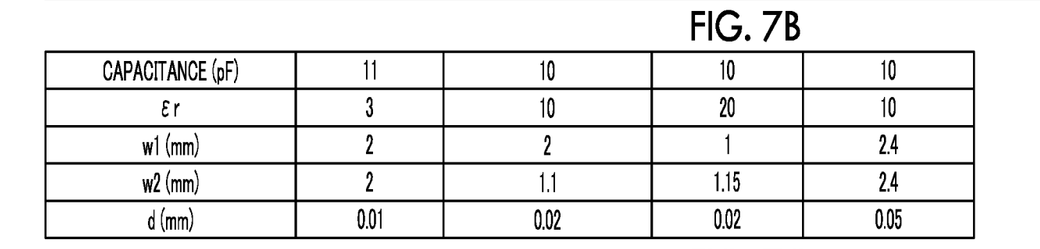
FIG. 7B is a table showing a relationship of a relative permittivity, a length in the front-rear direction, a length in the right-left direction, and a thickness for a dielectric layer to satisfy about 10 pF as a capacitance.
Figure 7C:
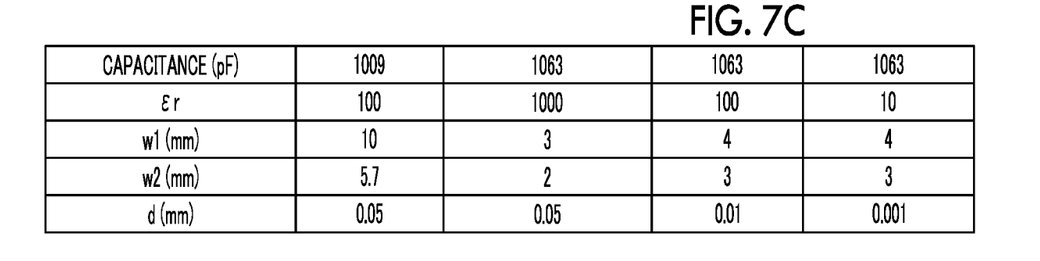
FIG. 7C is a table showing a relationship of a relative permittivity, a length in the front-rear direction, a length in the right-left direction, and a thickness for the dielectric layer to satisfy about 1000 pF as a capacitance.

FIG. 7B is a table showing a relationship between the relative permittivity, the length a, the length b, and the thickness d for the dielectric layer 1322 to satisfy about 10 pF as a capacitance. FIG. 7C is a table showing a relationship between the relative permittivity, the length a, the length b, and the thickness d for the dielectric layer 1322 to satisfy about 1000 pF as a capacitance.

The term "capacitance" shown in FIGS. 7B and 7C means a capacitance of the dielectric layer 1322.

The term "εr" shown in FIGS. 7B and 7C means a relative permittivity of the dielectric layer 1322.

The term "w1" shown in FIGS. 7B and 7C means a length a (refer to FIG. 3A) of the dielectric layer 1322 in the front-rear direction.

The term "w2" shown in FIGS. 7B and 7C means a length b (refer to FIG. 3A) of the dielectric layer 1322 in the right-left direction.

The term "d" shown in FIGS. 7B and 7C means a thickness d (refer to FIG. 2) of the dielectric layer 1322 in the up-down direction.

The examples shown in FIGS. 7B and 7C have described that the "w1" is the length a of the dielectric layer 1322 in the front-rear direction, and the "w2" is the length b of the dielectric layer 1322 in the right-left direction, but the present invention is not limited to this. The "w1" may be the length b of the dielectric layer 1322 in the right-left direction, and the "w2" may be the length a of the dielectric layer 1322 in the front-rear direction.

The capacitances shown in FIGS. 7B and 7C are calculated from Expression (2).

$$C = \varepsilon \times \varepsilon r (w1 \times w2)/d \quad (2)$$

In Expression (2), C is a capacitance of the dielectric layer 1322. ε is a permittivity of the vacuum. FIGS. 7B and 7C show capacitances each rounded to the first decimal place.

The values shown in FIGS. 7B and 7C will be specifically described. In any of the detection apparatuses 1 shown in FIG. 7B, the capacitance of the dielectric layer 1322 is 10 pF or more. In other words, in the dielectric layer 1322, the relationship of the relative permittivity, the length a in the front-rear direction, the length b in the right-left direction, and the thickness d in the up-down direction is the relationship shown in the drawing. In such a case, the capacitance of the dielectric layer 1322 is 10 pF or more.

In any of the detection apparatuses 1 shown in FIG. 7C, the capacitance of the dielectric layer 1322 is about 1000 pF. In other words, in the dielectric layer 1322, the relationship of the relative permittivity, the length a in the front-rear direction, the length b in the right-left direction, and the thickness d in the up-down direction is the relationship shown in the drawing. In such a case, the capacitance of the dielectric layer 1322 is about 1000 pF.

FIG. 7B shows that the area of the dielectric layer 1322 is "1.15×10$^{-6}$ m$^2$" which is the minimum value among the values shown in FIGS. 7B and 7C in a case where the "εr" is "20" and the "d" is "0.02". However, in a case where the relative permittivity of the dielectric layer 1322 is made higher or the thickness d of the dielectric layer 1322 is made shorter, even in a case where the area of the dielectric layer 1322 is "10$^{-7}$ m$^2$", the capacitance of the dielectric layer 1322 is 10 pF or more and 1000 pF or less. That is, an area of the dielectric layer 1322 necessary for the dielectric layer 1322 to satisfy the capacitance of 10 pF or more and 1000 pF or less may be at least "10$^{-7}$ m$^2$" or more.

FIG. 7C shows that the area of the dielectric layer 1322 is "5.7×10$^{-5}$ m$^2$" which is the maximum value among the values shown in FIGS. 7B and 7C in a case where the "εr" is "100" and the "d" is "0.05". However, in a case where the relative permittivity of the dielectric layer 1322 is made lower or the thickness d of the dielectric layer 1322 is made longer, even in a case where the area of the dielectric layer 1322 is "10$^{-3}$ m$^2$", the capacitance of the dielectric layer 1322 is 10 pF or more and 1000 pF or less. That is, an area of the dielectric layer 1322 necessary for the dielectric layer 1322 to satisfy the capacitance of 10 pF or more and 1000 pF or less may be "10$^{-3}$ m$^2$" or less.

FIG. 7C shows that the "d" is "0.001 mm" which is the minimum value among the values shown in FIGS. 7B and 7C in a case where the "εr" is "10", the "w1" is "4", and the "w2" is "3". However, in a case where the relative permittivity of the dielectric layer 1322 is made lower or the area of the dielectric layer 1322 is made narrower, even in a case where the "d" is "0.0005 mm", the capacitance of the dielectric layer 1322 is 10 pF or more and 1000 pF or less. That is, a thickness d of the dielectric layer 1322 necessary for the dielectric layer 1322 to satisfy the capacitance of 10 pF or more and 1000 pF or less may be at least "0.0005 mm" or more.

FIG. 7C shows that the maximum value of "d" among the values shown in FIGS. 7B and 7C is "0.05 mm". However, in a case where the relative permittivity of the dielectric layer 1322 is made higher or the area of the dielectric layer 1322 is made wider, even in a case where "d" is "0.1 mm", the capacitance of the dielectric layer 1322 is 10 pF or more and 1000 pF or less. That is, a thickness d of the dielectric layer 1322 necessary for the dielectric layer 1322 to satisfy the capacitance of 10 pF or more and 1000 pF or less may be "0.1 mm" or less.

FIG. 7C shows that the "εr" is "1000" which is the maximum value among the values shown in 7B and FIG. 7C in a case where the "w1" is "3", the "w2" is "2", and the "d" is "0.05". However, in a case where the area of the dielectric layer 1322 is made smaller or the thickness of the dielectric layer 1322 is made longer, even in a case where "εr" is "10000", the capacitance of the dielectric layer 1322 is 10 pF or more and 1000 pF or less. That is, a relative permittivity of the dielectric layer 1322 necessary for the dielectric layer 1322 to satisfy the capacitance of 10 pF or more and 1000 pF or less may be "10000" or less.

As described above, in the present exemplary embodiment, the dielectric layer 1322 has an area of 10$^{-7}$ m$^2$ or more and 10$^{-3}$ m$^2$ or less, a thickness of 5×10$^{-7}$ m or more and 10$^{-4}$ m or less, and a relative permittivity of 3 or more and 104 or less. In the detection apparatus 1, the detection target includes a distance of 0.1 m or more and 500 m or less as the distance to the target object T.

In particular, in the present exemplary embodiment, the dielectric layer 1322 has an area of 10$^{-6}$ m$^2$ or more and 10$^{-4}$ m$^2$ or less, a thickness of 10$^{-6}$ m or more and 5×10$^{-5}$ m or less, and a relative permittivity of 3 or more and 103 or less.

In the present exemplary embodiment, the substrate 13 of the light emitting device 10 has a dielectric layer 1322 having a capacitance of 10$^{-11}$ F or more and 10$^{-9}$ F or less and being a dielectric substance, and has a capacitor layer 132 provided in the resonant circuit RC.

The present exemplary embodiment has described that an electric accumulation element other than the capacitor layer 132 is provided in the light emitting device 10, but the present invention is not limited to this.

For example, not only the capacitor layer 132 but also an electric accumulation element having a thickness smaller than a thickness of the capacitor layer 132 may be provided on the substrate 13. That is, an electric accumulation element having a thickness larger than a thickness of the capacitor layer 132 and accumulating electric charge may not be provided in the resonant circuit RC. In other words, an electric accumulation element, which has a dielectric substance having a thickness larger than a thickness of the dielectric layer 1322, may not be provided in the resonant circuit RC.

For example, in the range where the capacitance in the resonant circuit RC is 10 pF or more and 1000 pF or less, another electric accumulation element may be provided in the resonant circuit RC in addition to the capacitor layer 132. That is, such an electric accumulation element of which the capacitance of the resonant circuit RC is greater than 1000 pF may not be provided in the resonant circuit RC.

Among the electronic circuits of the light emitting device 10, an electric accumulation element may be provided in a circuit different from the resonant circuit RC. For example, in the light emitting device 10, an electric accumulation element having a thickness larger than a thickness of the capacitor layer 132 or an electric accumulation element having a capacitance greater than 1000 pF may be connected to the electric path between the power supply 14 and the resonant circuit RC.

All the resonant circuits RC may be provided on the substrate 13. That is, at least a part of the resonant circuit RC may be provided on the substrate 13.

In the present exemplary embodiment, the example in which the detection apparatus 1 is provided in the movable body 2 has been described, but the detection apparatus 1 may be provided in an object of which the position does not change. In a case where the detection apparatus 1 is provided in an object of which the position does not change, the detection apparatus 1 measures the distance to the target object T, and thereby it is possible to grasp the positional relationship between the detection apparatus 1 and the target object T in a space where the target object T is present.

In the present exemplary embodiment, an example in which the light emitting device 10 is applied to the detection apparatus 1 has been described, but the target to which the light emitting device 10 is applied is not limited to the detection apparatus 1.

For example, the light emitting device 10 may be applied to an apparatus that transmits light by combining a light emitting device 10, a light transmission path, and a light receiving unit 20. The light emitting device 10 may be applied to an apparatus that detects the internal structure of the target object T by irradiating the inside of the target object T such as a living body with the light of the light emitting device 10.

The present exemplary embodiment has described that the VCSEL is used as the light emitting device 10, but the light emitting device 10 may be a light emitting diode (LED).

The present exemplary embodiment has described that the light emitting element 11 emits light toward the upper side (refer to FIG. 2), but the present invention is not limited to this. The light emitting element 11 may emit light toward the lower side, that is, the rear surface of the substrate 13.

A transfer element, which is specialized for controlling the timing at which the light emitting element 11 emits light in a case where the current in the resonant circuit RC is supplied, may be provided on the substrate 13. As a specific example of the transfer element, the light emitting element 11 may be configured by a light emitting thyristor connected in series with the VCSEL, and the transfer thyristor that supplies a signal to be emitted to the light emitting thyristor may be configured monolithically.

Although the exemplary embodiments of the present invention have been described above, the technical scope of the present invention is not limited to the scope described in the above exemplary embodiments. It is clear from the description of the claims that the above-mentioned exemplary embodiment with various modifications or improvements is also included in the technical scope of the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting device comprising:
a substrate, having an electric accumulation layer that accumulates electric charge, wherein the electric accumulation layer is a first part of a resonant circuit in which resonance occurs; and
a light emitting element that is a second part of the resonant circuit coupled to the first part of the resonant circuit, wherein the light emitting element emits light in a case where a current in the resonant circuit is supplied,
wherein
the resonant circuit is not provided with an electric accumulation element other than the electric accumulation layer and having a thickness larger than a thickness of the electric accumulation layer.

2. A detection apparatus comprising:
the light emitting device according to claim 1;
a light receiving unit that receives light based on irradiation of a target object with light emitted from the light emitting device; and
a detection unit that detects a distance to the target object on the basis of light reception of the light receiving unit,
wherein the electric accumulation layer has a dielectric layer that is a dielectric substance,
the dielectric layer has an area of $10^{-7}$ m$^2$ or more and $10^{-3}$ m$^2$ or less, a thickness of $5 \times 10^{-7}$ m or more and $10^{-4}$ m or less, and a relative permittivity of 3 or more and 104 or less, and
a detection target includes a distance of 0.1 m or more and 500 m or less as a distance to the target object.

3. The detection apparatus according to claim 2,
wherein the dielectric layer has an area of 10–6 m2 or more and 10–4 m2 or less, a thickness of 10–6 m or more and $5 \times 10$–5 m or less, and a relative permittivity of 3 or more and 103 or less.

4. The light emitting device according to claim 1, further comprising:
a suppression unit that is connected to a circuit between a power supply that supplies electric charge to the electric accumulation layer and the resonant circuit and suppresses electric charge transfer between the power supply and the resonant circuit.

5. The light emitting device according to claim 4,
wherein the suppression unit cuts off conduction in the circuit between the power supply and the resonant circuit.

6. The light emitting device according to claim 1,
wherein the substrate has a plurality of layers including the electric accumulation layer, and
the light emitting element is provided to overlap the plurality of layers.

7. The light emitting device according to claim 6,
wherein the plurality of layers include a layer provided in the resonant circuit, through which a current supplied to the light emitting element passes.

8. A light emitting device comprising:
a substrate, having an electric accumulation layer that accumulates electric charge, wherein the electric accumulation layer is a first part of a resonant circuit in which resonance occurs; and
a light emitting element that is a second part of the resonant circuit coupled to the first part of the resonant circuit, wherein the light emitting element emits light in a case where a current in the resonant circuit is supplied,
wherein the electric accumulation layer of the substrate has a dielectric layer is a dielectric substance that has a capacitance of $10^{-11}$ F or more and $10^{-9}$ F or less, and the dielectric layer is provided in the resonant circuit.

* * * * *